United States Patent [19]
McIntosh

[11] 3,745,376
[45] July 10, 1973

[54] FREQUENCY SELECTIVE CIRCUIT INCLUDING A TWIN-T NOTCH FILTER

[75] Inventor: Alexander C. McIntosh, Oak Harbor, Wash.

[73] Assignee: Tel-Tone Corporation, Kirkland, Wash.

[22] Filed: Apr. 28, 1972

[21] Appl. No.: 248,397

[52] U.S. Cl. .................... 307/233, 307/295
[51] Int. Cl. .................... H03k 5/20
[58] Field of Search .................... 307/233; 330/28

[56] References Cited

UNITED STATES PATENTS

| | | | |
|---|---|---|---|
| 3,193,774 | 7/1965 | Clapper | 307/233 X |
| 3,405,368 | 10/1968 | Howe | 330/28 X |
| 3,571,740 | 3/1971 | Goncharoff | 330/28 |
| 3,174,111 | 3/1965 | Grover | 330/28 |
| 3,460,000 | 8/1969 | Kiffmeyer | 307/233 X |
| 3,586,986 | 6/1971 | Martens et al. | 307/233 X |

*Primary Examiner*—William M. Shoop, Jr.
*Attorney*—Christensen & Sanborn

[57] ABSTRACT

A highly frequency selective circuit that includes a twin-T notch filter connected in the feedback path of a transistor is disclosed. Also included in the feedback path is an isolation network formed of a pair of emitter coupled transistors. One of the isolation transistors is fed by the feedback signal from the twin-T notch filter and the other is fed by the input signal to the overall frequency selective circuit.

3 Claims, 3 Drawing Figures

FREQUENCY SELECTIVE CIRCUIT INCLUDING A TWIN-T NOTCH FILTER

BACKGROUND OF THE INVENTION

This invention relates to filter circuits and more particularly to frequency selective filter circuits having a very narrow bandwidth.

A wide variety of inexpensive and uncomplicated electronic frequency selective filter circuits have been proposed and are in use. While many such circuits adequately perform a selective signal passing function when there is a large frequency separation between a selected signal and a plurality of other signals, many of them are inadequate to select a desired signal when the plurality of signals are relatively closely spaced in frequency. In other words, most prior art inexpensive and uncomplicated frequency selective filter circuits have a relatively wide pass band. Because of this wide pass band, these devices are generally unsuitable for use in certain environments. For example, many prior art inexpensive and uncomplicated filter circuits are unsatisfactory for use in telephone and related fields where detection of multi-frequency difference components is required.

One example of a prior art circuit that is relatively uncomplicated, yet does not have a pass band as narrow as the pass band of the instant invention, is descirbed in U.S. Pat. No. 3,193,774 issued to Clapper. While that patent discloses the use of a twin-T notch filter in the feedback path of an active element, it does not have as narrow a pass band as does the instant invention because it lacks other components connected in the desired manner.

While there are electronic frequency selective circuits that have relatively narrow pass bands, these circuits are generally relatively complicated and, therefore, inexpensive to produce and use. Hence, they are not suited for as widespread use as is a circuit that is uncomplicated.

Therefore, it is an object of this invention to provide a new and improved filter circuit.

It is also an object of this invention to provide a new and improved frequency selective circuit that has a relatively narrow pass band.

It is a still further object of this invention to provide a new and improved electronic filter circuit that has a relatively narrow pass band yet is inexpensive and uncomplicated to manufacture and use.

SUMMARY OF THE INVENTION

In accordance with the principles of this invention a highly frequency selective circuit is provided. The frequency selective circuit includes an active electronic device, such as a transistor. A twin-T notch filter and an isolation circuit are connected to form a feedback path for the transistor. This overall combination provides a frequency selective circuit that has a very narrow pass band of less than ±1.2 percent at the half voltage points.

In accordance with other principles of this invention, the isolation circuit comprises a pair of emitter coupled transistors of opposite polarity, i.e., one transistor is an NPN transistor and the other is a PNP transistor. The base of one transistor is connected to the output of the twin-T notch filter and its collector is connected to ground. The base of the other is connected to the signal input terminal of the overall frequency selective circuit and its collector is connected to the base of the active electronic device (e.g., transistor).

It will be appreciated, from the foregoing brief description, that an uncomplicated and, therefore, inexpensive frequency selective circuit having a very narrow pass band is provided by the invention. The circuit is inexpensive and uncomplicated because it only requires a suitable isolation network in combination with a twin-T notch filter connected to form a feedback path for an active device such as a transistor. The twin-T notch filter selects the frequency of the overall system. If the frequency of the incoming signal is exactly at the "pass" or notch frequency of the twin-T notch filter, zero feedback occurs since the signals cancel in the parallel arms of the twin-T notch filter. If, on the other hand, the signal input has a frequency component that deviates somewhat from the notch frequency, a portion thereof appears on the output of the twin-T network. This portion causes a degeneration of the input signal applied to the active device. Thus, the deviate signal is prevented from passing through the overall circuit.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENT

Prior to discussing a preferred embodiment of the invention, a multi-tone frequency detection system is first discussed so that one area of invention use will be better understood.

Figure 1:
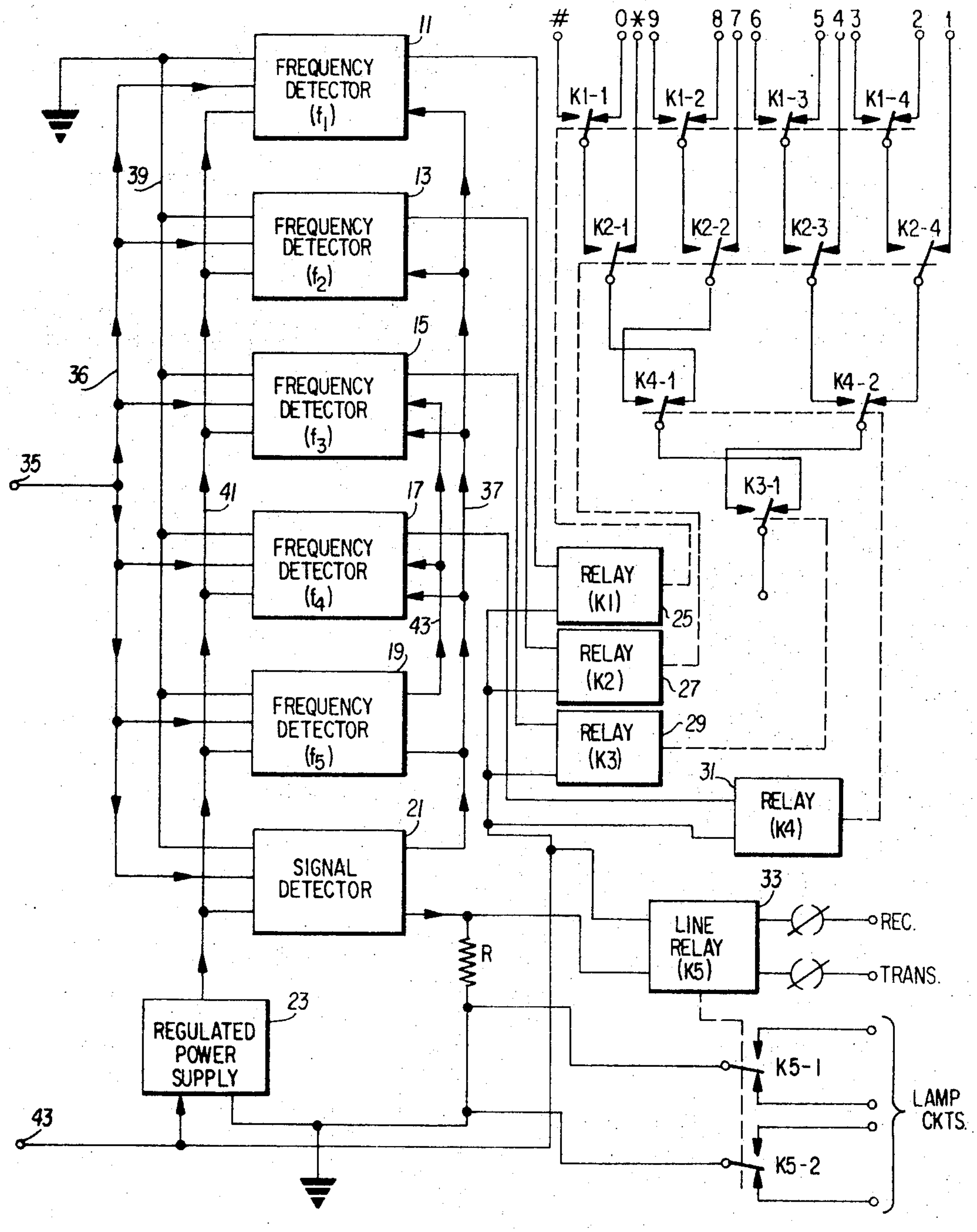
FIG. 1 is a block diagram of a convention multi-frequency tone detector system suitable for use in telephone and related fields.

FIG. 1 illustrates a multi-tone frequency detection system which comprises: five frequency detectors 11, 13, 15, 17 and 19; a signal detector 21; a regulated power supply 23; four signal relays 25, 27, 29 and 31; and, a line relay 33. The first frequency 11 detects signals at frequency $f_1$; the second frequency detector 13 detects signals at frequency $f_2$; the third frequency detector 15 detects signals at frequency $f_3$; the fourth frequency detector 17 detects signals at frequency $f_4$; and, the fifth frequency detector 19 detects signals at frequency $f_5$. The signal detector detects all signal frequencies in the range of interest, i.e., $f_1$ through $f_5$.

Input signals are received at an input terminal 35 connected via a signal line 36 to each of the frequency detectors and to the signal detector 21. Both the frequency detectors and the signal detectors are grounded via a suitable ground line 39. In addition, the frequency detectors and signal detector all receive power from the regulated power supply 27 via a power line 41. Further all four of the frequency detectors receive control signals from the signal detector via a control line 37.

The regulated power supply receives unregulated power from a suitable unregulated source connected to a power terminal 43. The power terminal 43 is also connected to one side of each of the four signal relays 25, 27, 29 and 31 and to one side of the line relay 33. The other side of the first signal relay 25 is connected to the output of the first frequency detector 11; the other side of the second signal relay 27 is connected to the output of the second frequency detector 13; the other side of the third signal relay is connected to the output of the third frequency detector 15; and, the other side of the fourth signal relay 31 is connected to the output of the fourth frequency detector 17. The output of the fifth frequency detector 19 is connected to the third and fourth frequency detectors 15 and 17 via an inhibit line 43. The line relay 33 has its other side connected to an output of the signal detector 21 which is also connected to ground via a resistor R.

The four signal relays 25, 27, 29 and 31 operate a relay matrix. For purposes of discussion the first signal relay is designated K1 and operates four sets of relay contacts designated K1-1, K1-2, K1-3 and K1-4. The second signal relay is designated K2 and operates four sets of relay contacts designated K2-1, K2-2, K2-3 and K2-4. The third signal relay is designated K3 and operates a single set of relay contacts designated K3-1. The fourth signal relay is designated K4 and operates two sets of relay contacts designated K4-1 and K4-2. Because the relay matrix passes signals along predetermined lines in accordance with well known telephone system concepts, the relay matrix per se will not be further discussed in detail here.

In operation, when an input signal is received at input terminal 35 it is applied to all of the frequency detectors and to the signal detector. Assuming the signal has suitable frequency components, the signal detector 21 generates a control signal on line 37 that is received by all of the frequency detectors 11, 13, 15, 17 and 19. When this occurs, the frequency detectors each detect whether or not the input signal contains a frequency component at their respective frequencies, $f_1$ through $f_5$. If such a component exists, the frequency detectors cause activation of their respective relays. More specifically, if the input signal contains an $f_1$ frequency component K1 is energized; if it contains an $f_2$ frequency component K2 is energized, etc. Finally, if the input signal contains an $f_5$ frequency component the third and fourth frequency detectors are inhibited because the fifth frequency detector generates an inhibit signal on line 43. If any of $f_1$ through $f_5$ do not exist, obviously the related frequency detector does not operate its respective relay or generate an inhibit signal, as the case may be. Energization of the signal relays change or do not change the matrix arrangement from the form illustrated in FIG. 1. The line relay 33 is energized by activation of the signal detector and causes its contacts designated K5-1 and K5-2 to energize suitable lamp circuits to indicate the receipt of a signal. Thereafter, the receiver and transmitter components of the telephone system are activated for audio transmission and reception purposes.

One of the major difficulties with systems of the type illustrated in FIG. 1 and described above, is the requirement for frequency detectors that operate over relatively narrow pass bands. More specifically, it is a general requirement that the frequency detectors have characteristics such that their bandwidth is no more than 30 Hz at the half voltage point for a center frequency of about 1000 Hz. To meet this stringent requirement prior art frequency detectors generally included complicated frequency selective circuits and, therefor, are expensive to manufacture. Contrawise, this invention provides a frequency selective circuit that is uncomplicated and inexpensive, yet still provides the desired selectivity. A circuit formed in accordance with the invention is illustrated in FIG. 2 and hereinafter described.

Figure 2:
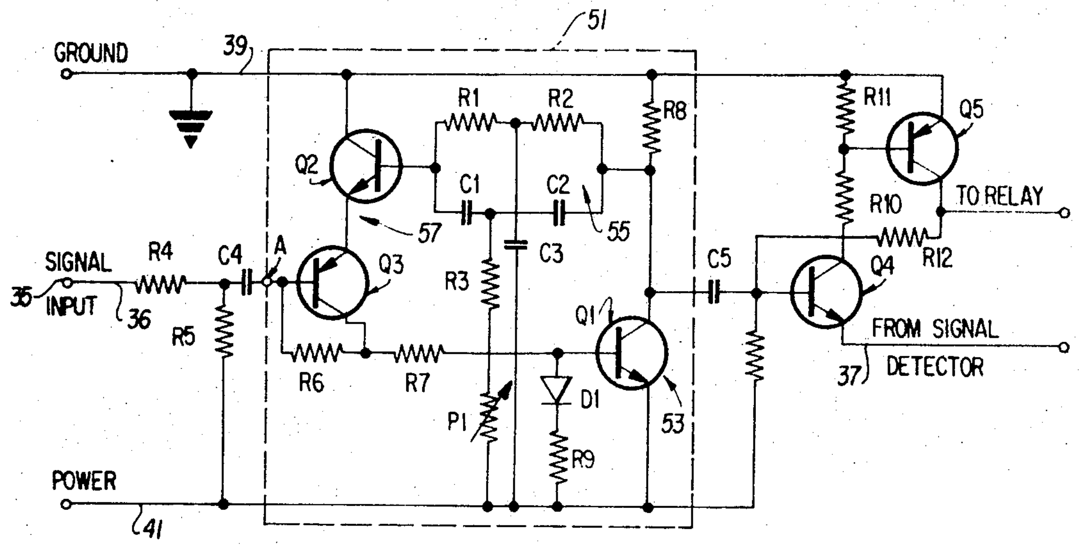
FIG. 2 is a schematic diagram of a frequency selective circuit formed in accordance with the invention; and, FIG. 3 is a graph illustrating the band width of a frequency selective circuit of the type illustrated in FIG. 2.

FIG. 2 illustrates a frequency detector circuit that includes a frequency selective circuit 51 of the type contemplated by the invention. The frequency selective circuit 51 is surrounded by a dashed line and comprises: an active device 53, such as an NPN transistor Q1; a twin-T notch filter 55 formed of three resistors R1, R2 and R3, a potentiometer P1 and three capacitors C1, C2 and C3; and, an isolation network 57 formed of an NPN transistor Q2 and a PNP transistor Q3.

The base of Q3 is connected to receive the incoming signal from the input terminal 35 via a resistor R4 connected in series with a capacitor C4. The junction between R4 and C4 is connected to the regulated power supply line 41 by a resistor R5. The base of Q3 is also connected through a pair or resistors R6 in series with R7 to the base of Q1. Hence, the input signal to the frequency selective circuit 51 at a point designated A in FIG. 2 is applied both to the base of Q3 and to the base of Q1. To complete this portion of the circuit, the collector of Q3 is connected to the junction between R6 and R7; the emitter of Q3 is connected to the emitter of Q2; and the collector of Q2 is connected to the ground line 39.

The twin-T notch filter is a blocking filter in that it blocks the passage of signals about a particular center frequency and pass signals outside of this narrow band or notch. The twin-T notch filter consists of R1, R2, R3, P1, C1, C2, and C3 is formed in a conventional manner. That is, R1 and R2 are connected in series as are C1 and C2 and these series circuits are connected in parallel. The junction between R1 and R2 is connected through C3 to the regulated power supply line 41. In addition the junction between C1 and C2 is connected through R3 in series with P1 to the regulated power supply line. The input or one side of the twin-T notch filter is the junction formed between R2 and C2 the output or other side is the junction between R1 and C1. The junction between R1 and C1 is connected to the base of Q2 and the junction between R2 and C2 is connected to the collector of Q1.

The collector of Q1 is also connected through a collector resistor R8 to ground. The emitter of Q1 is connected to the regulated power supply line 41. The base of Q1 is also connected through a diode D1 in series with a resistor R9 to the regulated power supply line.

In order to complete the description of the overall signal detector, the remaining components to the right of the dashed block are hereinafter described. The collector of Q1 is connected through a capacitor C5 to the base of an NPN transistor Q4. The emitter of Q4 is connected to the signal detector circuit 21 illustrated in FIG. 1 via the control signal line 37. The collector of Q4 is connected through a pair of series connected resistors R10 and R11 to ground. The junction between R10 and R11 is connected to the base of an PNP transistor Q5. The emitter of Q5 is connected to ground and the collector of Q5 is connected to the relay related to the particular signal detector being described. The collector of Q5 is also connected through a resistor R12 to the base of Q4. The only items not shown in FIG. 2 are inhibiting transistor switches connected between Q4 and Q5 of the third and fourth signal detectors 15 and 17 (FIG. 1) to provide inhibiting under certain conditions, i.e., the fifth frequency detector 19 being energized. Since these latter items are not important to the operation of the invention, they will not be further discussed.

It will be appreciated from viewing FIG. 2 that the frequency selective circuit of the invention basically comprises an active element 53 having a twin-T notch filter 55 and an isolation network 57 connected to feedback a part of the active element's signal so as to degenerate the input signal under certain circumstances. More specifically, when a signal is received at input terminal 35, it is coupled via C4 to point A. The signal passes from point A through R6 and R7 to Q1. If the frequency of the signal is exactly the same as the signal passing frequency (notch frequency) of the twin-T notch filter 55, the paths of the twin-T notch filter cancel the signal so that it is not applied to Q2. Hence, such a signal does not activate Q2 and thereby couple Q3 to ground. If at the same a signal is being received from the signal detector via control line 37, Q4 passes the signal from Q1 to Q5 and Q5 activates the respective relay. R12 acts to lock "on" Q4 and Q5.

On the other hand, if the input signal is not precisely at the center or passing frequency of the twin-T notch filter, 55, a portion of it passes through the filter and is applied to Q2. At this time O3 is also activated because it is receiving the incoming signal. Now, because both transistors are activated a portion of the signal is applied to ground line 39. Thus, Q2 and Q3 provide a degeneration path for the incoming signal. In addition, they provide isolation between the incoming signal and the feedback signal. The farther the incoming signal deviates from the center frequency the greater the amount of degenerative feedback.

Figure 3:
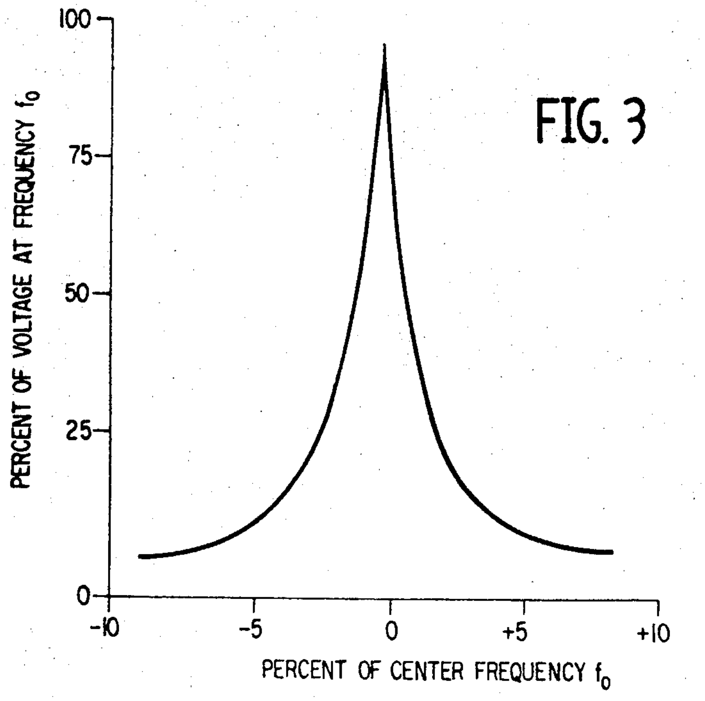

FIG. 3 is a graph illustrating the percent of input voltage passed by the frequency selective circuit of the invention on either side of a center frequency $f_0$ with regard to the percent of deviation from the center frequency. As seen from FIG. 3, at the center frequency, $f_0$, 100 percent of the voltage of the input signal is passed by the frequency selective circuit, ignoring circuit losses, of course. However, as the frequency starts to deviate from $f_0$, the percentage voltage passed rapidly decreases to the noise level of the overall circuit. For example, only about 10–15 percent of the voltage of an input signal at a frequency of $\pm5$ percent of $f_0$ is passed. In general, the invention provides a half voltage bandwidth of $\pm1.2$ percent of $f_0$. Thus if $f_0$ is 1000 Hz, the half voltage bandwidth will be 24Hz.

It will be appreciated from the foregoing description, that the instant invention provides a frequency selective circuit having a very narrow band pass with relatively uncomplicated components. As best understood, it is the use of the emitter coupled transistors Q2 and Q3 in the feedback path in combination with the remaining elements of the frequency selective circuit that provides the narrow bandwidth characteristic. While certain prior art circuits have been proposed that include a single transistor connected in a feedback path, such as the circuit described in U.S. Pat. No. (3,193,774) to Clapper, these circuits do not provide the frequency selective characteristics of the instant invention. For example, it is apparent from FIG. 2 of the Clapper patent that a band pass of approximately 15 Hz exists about his center frequency of 1200Hz. As discussed above, the instant invention provides a much narrower pass band, i.e., 24Hz about a center frequency of 1000Hz. Consequently, the invention is admirably suitable for use in systems such as multi-tone telephone systems which require that the pass band be no greater than 30Hz at the half voltage points for frequencies in this general range. Yet, it will also be appreciated from the foregoing description that the invention utilizes inexpensive components connected in an uncomplicated manner. Hence, the invention is also inexpensive to manufacture.

While the foregoing description has described a preferred embodiment of the invention it will be appreciated by those skilled in the art and others that various changes can be made therein commensurate with the spirit and scope of the invention. Hence, the invention can be practice otherwise than as specifically described herein.

The embodiments of the invention in which an exclusive property or privilege is claimed are defined as follows:

I claim:

1. A frequency selective circuit comprising:

an active electronic device having an input and an output;

a twin-T notch filter having an input connected to the output of said active electronic device; and first and second emitter coupled transistors, the base of said first transistor being connected to the input of said active electronic device and the base of said second transistor being connected to the output of said twin-T notch filter.

2. A frequency selective circuit as claimed in claim 1 wherein said active electronic device includes a third transistor having a collector serving as the output of said active electronic device.

3. A frequency selective circuit as claimed in claim 2 wherein the collector of said third transistor is coupled to ground and wherein the collector of said second transistor is connected to ground.

* * * * *